United States Patent [19]

Bronner et al.

[11] Patent Number: 5,360,758
[45] Date of Patent: Nov. 1, 1994

[54] SELF-ALIGNED BURIED STRAP FOR TRENCH TYPE DRAM CELLS

[75] Inventors: Gary B. Bronner, Mt. Kisco, N.Y.; John K. DeBrosse, Burlington; Donald M. Kenney, Shelburne, both of Vt.

[73] Assignee: International Business Machines Corporation, Armonk, N.Y.

[21] Appl. No.: 161,823

[22] Filed: Dec. 3, 1993

[51] Int. Cl.5 ............... H01L 21/70; H01L 27/00
[52] U.S. Cl. .................... 437/52; 437/47; 437/60; 437/919
[58] Field of Search ........... 437/47, 52, 60, 919; 257/301, 68, 308

[56] References Cited

U.S. PATENT DOCUMENTS

| | | | |
|---|---|---|---|
| 4,688,063 | 8/1987 | Lu et al. | 357/23.6 |
| 4,801,988 | 1/1989 | Kenney | 357/23.6 |
| 5,049,518 | 9/1991 | Fuse et al. | 437/52 |
| 5,200,354 | 4/1993 | Om et al. | 437/52 |
| 5,225,697 | 7/1993 | Malhi et al. | 257/302 |

Primary Examiner—Olik Chaudhuri
Assistant Examiner—H. Jey Tsai

[57] ABSTRACT

A deep trench type DRAM cell with shallow trench isolation has a buried polysilicon strap that is defined without the use of a separate mask by depositing the strap material over at least the deep trench before shallow trench definition and using the shallow trench isolation mask to overlap partially the deep trench, thereby defining the strap during the process of cutting the shallow trench.

7 Claims, 2 Drawing Sheets

SELF-ALIGNED BURIED STRAP FOR TRENCH TYPE DRAM CELLS

TECHNICAL FIELD

The field of the invention is that of integrated circuit dynamic random access memories (DRAMs).

BACKGROUND ART

In the field of DRAMs, the key issue is the size of the individual cell. One approach that has been followed in the art is the use of a deep trench capacitor, in order to save space on the surface. Once a capacitor layout has been chosen, there is an essential step of connecting the capacitor to the access transistor. Conventionally, this is done with a conductive strap which may be on the surface or may be buried. The size of the strap and methods of forming it without introducing additional process steps are key to economical production of DRAMs.

BRIEF DESCRIPTION OF THE INVENTION

The invention relates to a method for making a self-aligned buried strap trench capacitor DRAM cell, in which the strap is formed without the need for an additional mask by using the step of forming a shallow trench isolation to define the strap as well as defining the isolation.

PREFERRED EMBODIMENT

Figure 1:
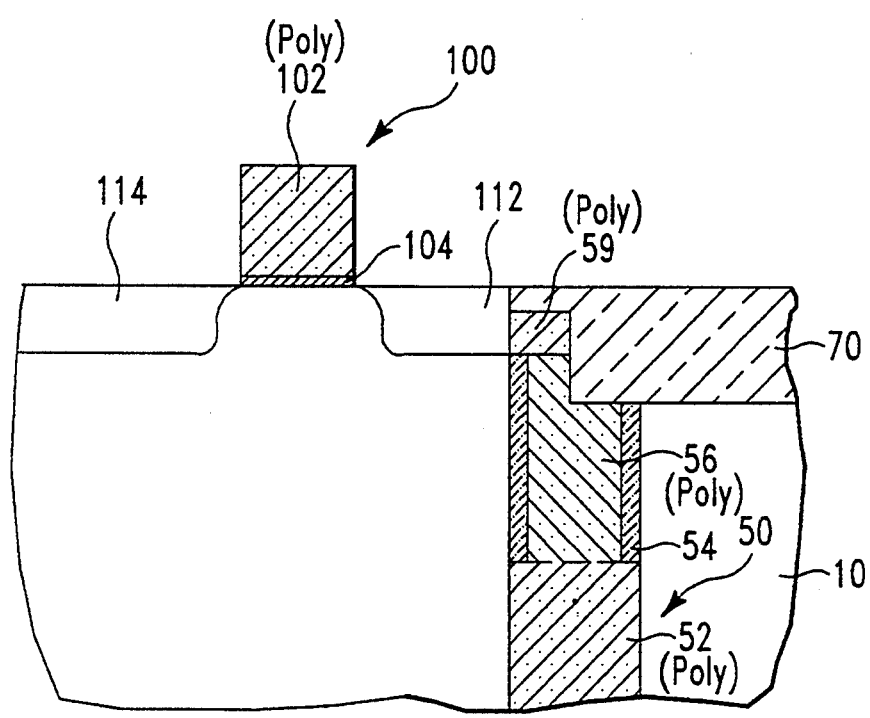
FIG. 1 illustrates in cross-section a DRAM cell constructed according to the invention.

Referring now to FIG. 1, there is shown a portion of a DRAM cell formed in substrate 10. A field-effect access transistor denoted generally by the numeral 100 has a source 110 and a drain 112 controlled by gate 102 as is conventional. On the right of the drawing, trench capacitor 50 is formed as is known in the art by etching a deep trench down into the substrate 10, forming an insulator along the trench surface (typically silicon dioxide and/or silicon nitride), filling it with doped polysilicon 52 up to a first level, then adding an insulating collar 54 of some convenient dielectric such as silicon dioxide (oxide) or silicon nitride (nitride).

The center portion is then filled with a second layer of conductive polysilicon 56. Strap 58 is shown at the top of electrode 56 connecting center electrode 56 to drain 112. An insulator 70 in the form of oxide filling a shallow trench is shown to the right of the transistor. The shallow trench isolation also extends behind and in front of the plane of the paper in order to isolate the DRAM cell.

Figure 2:
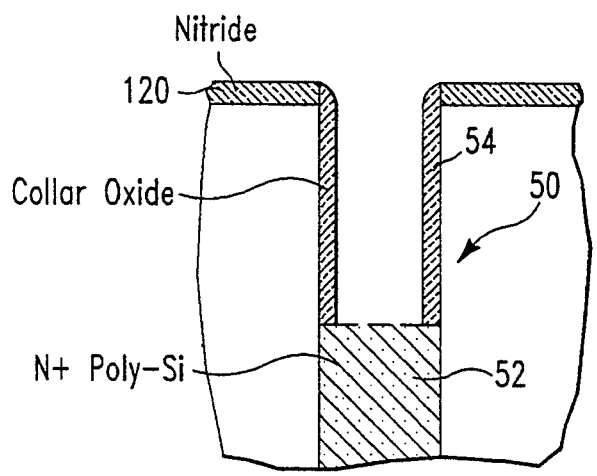
FIGS. 2–5 illustrate in cross-section a portion of the DRAM cell at various stages in the inventive method.
Figure 3:
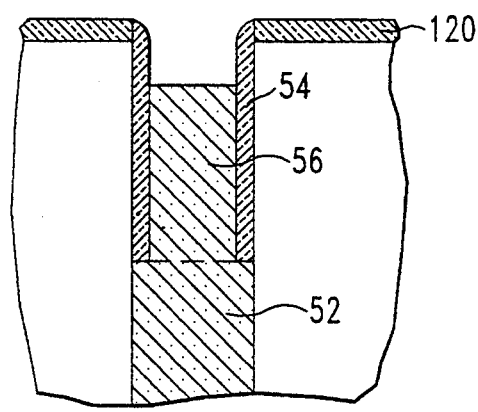

Referring now to FIG. 2, there is shown a preliminary step in the formation of trench 50 after the deposition of lower polysilicon 52 and the deposition of the collar oxide 54. Previously, the N- or P-wells have been formed in the substrate and a protective layer of nitride 120 has been deposited that serves as a polish stop and thus as a reference surface in subsequent steps. These conventional and other steps will be referred to as preparing the substrate. The formation of trench 50 is also conventional, well known to those skilled in the art (as illustrated in U.S. Pat. No. 4,688,063 and U.S. Pat. No. 4,801,908). In FIG. 3, the next step of refilling deep trench 50 with a second layer of polysilicon 56 and recessing this second layer of polysilicon 56 has been performed. Polysilicon 56 has been etched back to a standard depth well below the surface in order to allow the formation of the strap as described below.

Figure 4:
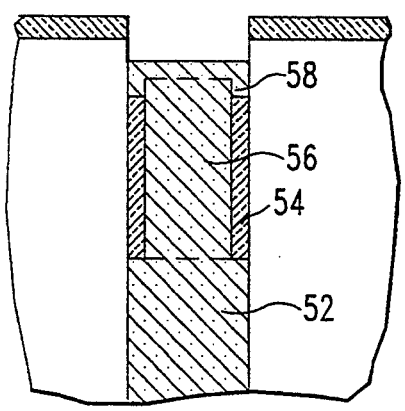

Referring now to FIG. 4, there is shown the third layer of polysilicon 58 having a nominal thickness of 100 nanometers above the top of the poly 56. This layer is formed by the blanket deposition of polysilicon and subsequent etch back using conventional techniques such as chemical mechanical polishing (CMP) and reactive ion etching. For example, CMP can be used to make the top surface of poly 58 at the same level as nitride 120 and a selective etch that does not attack nitride such as sulfur hexafluoride ($SF_6$) can be used to recess layer 58 below that surface.

This polysilicon layer can be deposited undoped or in-situ doped with arsenic or,"phosphorus, conveniently the active area and polysilicon layer may be implanted after the transistor gate 102 is in place." If the layer is deposited undoped, dopant from lower polysilicon layers 52 and 56 will diffuse upwards to dope it during conventional heat cycles used in conventional transistor fabrication. Arsenic is preferred because it diffuses at a slower rate than phosphorous.

Since the top of oxide 54 has been etched down to the lower portion of the strap, the strap can make electrical contact with the area of the substrate below and in drain 112 at the vertical surface denoted with the numeral 113. Drain 112 will be formed directly to the left of the strap 58 in FIG. 1. It will be recognized by those familiar with DRAM fabrication that the drain can be located on either side of the trench depending on the location in the memory cell array.

Figure 5:
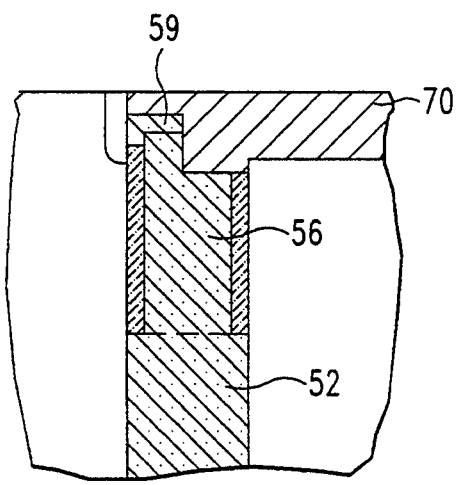
Figure 6:
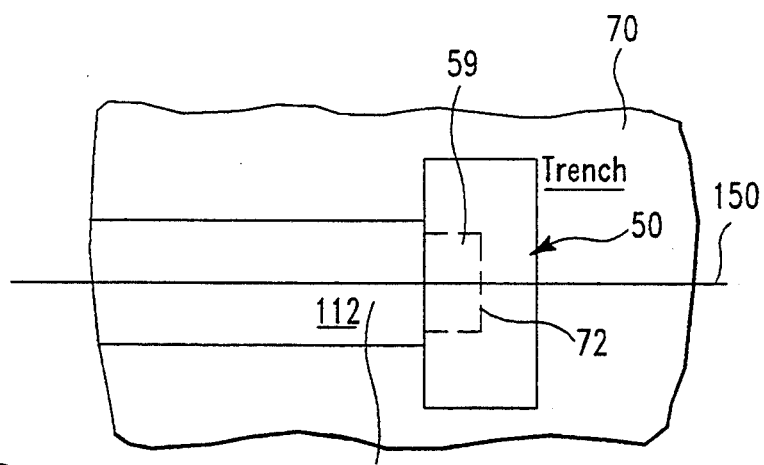
FIG. 6 illustrates a top view of the DRAM cell.

Referring now to FIGS. 5 and 6, there is shown the trench and strap 59 after the formation of the shallow trench isolation 70. FIG. 6, a top view, shows that trench 70 extends to the front and back of the cell, front and back being taken with reference to axis 150, which is the plane through which these cross-sections have been taken. Trench 70 defines the active area that will contain transistor 100, which is formed in a later step. The left edge of trench 70, denoted by the numeral 72, is offset to the right of drain 112 to allow a portion of layer 58 to remain as strap 59. This left edge of trench 70 is a critical alignment in the sense that it has to be precise, but it need only be within the coverage of the center electrode 56. It does not matter much if it extends slightly to the left or to the right, providing valuable process tolerance.

Trench 70 is cut down below the depth of the strap so that the strap material is removed in the entire area of the trench. In FIG. 5, a shallow layer of oxide is shown above strap 59, outside trench 70. Since the strap is recessed below the surface, it will be covered by the dielectric, such as oxide, that is deposited to fill trench 70. The thickness of the oxide over strap 59 is not critical and need only be enough to provide adequate isolation if a conductor is placed over the strap. Typically, 50 nm of oxide is adequate for 3.3 V circuits. After trench 70 has been filled, the surface is planarized by chemical-mechanical polishing to be coplanar with the silicon nitride layer 120. The nitride layer 120 acts as a planarization stopping layer. After this planarization step, layer 120 is removed creating the structure shown in FIG. 5. The removal of the nitride layer 120 will result in the formation of a small step between the silicon substrate 10 and the oxide filled trench 70. This step will be small (typically less than 100 nm) and will be decreased during subsequent processing. Typical cleaning steps used in integrated circuit processing will include dips in hydrofluoric acid (HF) which will recess the oxide in the trench selectively to the substrate leaving a structure that is coplanar as shown in FIG. 5.

After trench 70 has been filled, a gate is defined and transistor 100 is finished in conventional manner. It is an important advantage of the present invention that strap 59 is self-aligned and uses no additional masking steps. The use of a shallow trench having an offset over the deep trench removes all of layer 58 except where it is needed. Poly 58 is deposited across the wafer and removed by CMP. Selective epitaxial growth could also be used instead of polysilicon deposition with some simplification of the CMP step, but at an overall cost increase due to tooling costs.

For the proposed dram cell to work properly the diffusion of dopant out of the buried strap 59 must be limited. Dopant could diffuse past drain region 112 and underneath gate 102 and short to source region 110 or come sufficiently close to source region 110 that it is not possible to turn device 100 off. Additionally, there may be leakage between adjacent cells under trench 70 if the strap dopant diffuses laterally under the trenches. The use of arsenic reduces any effects from the foregoing. In the case of a DRAM array having 0.25 μm minimum features, it has been found that controlling the outdiffusion to be less than 0.1 μm from the side of the trench reduces these two effects to insignificance.

We claim:

1. A method of making a DRAM cell having a trench capacitor in a substrate and an access transistor connected thereto comprising the steps of:
   preparing the substrate;
   forming a trench capacitor having a trench center electrode and a collar insulator in said substrate adjoining an active region of said substrate;
   recessing said trench center electrode to a buried strap depth;
   removing said collar insulator to said buried strap depth;
   depositing a layer of strap material above said trench center electrode, whereby said strap material contacts a portion of said substrate below said active area;
   etching a shallow trench having a shallow trench depth greater than said buried strap depth in a trench isolation area about said active area and partially overlapping said trench capacitor along a first axis through said active area, whereby that portion of said layer of strap material in said trench isolation area is removed and a strap, extending from an edge of said active area over a portion of said trench center electrode and formed from said strap material, remains;
   forming a transistor in said active area with an electrode extending to make electrical contact with said strap, whereby said trench capacitor, strap and transistor combine to form said DRAM cell.

2. A method according to claim 1 in which said strap material is conductive and in which said step of forming said transistor includes implanting said active area after a transistor gate is in place, whereby a conductive path is formed from said transistor electrode through said strap to said trench center electrode.

3. A method according to claim 1, in which said step of depositing said strap material includes a step of removing said strap material outside said trench capacitor and then recessing said strap material below a reference surface above said active region.

4. A method according to claim 1, in which said strap material has a strap top surface below an active area top surface;
   said shallow trench is filled with a dielectric that also covers said strap; and
   said dielectric is planarized to be coplanar with said active area top surface.

5. A method according to claim 4 in which said strap material is conductive and in which said step of forming said transistor includes implanting said active area after a transistor gate is in place, whereby a conductive path is formed from said transistor electrode through said strap to said trench center electrode.

6. A method according to claim 3, in which said strap material has a strap top surface below an active area top surface;
   said shallow trench is filled with a dielectric that also covers said strap; and
   said dielectric is planarized to be coplanar with said active area top surface.

7. A method according to claim 6, in which said strap material is conductive and in which said step of forming said transistor includes implanting said active area after a transistor gate is in place, whereby a conductive path is formed from said transistor electrode through said strap to said trench center electrode.

* * * * *